United States Patent
Sirane et al.

(10) Patent No.: US 6,509,741 B2
(45) Date of Patent: Jan. 21, 2003

(54) METHOD FOR SCREENING MULTI-LAYER CERAMIC ELECTRONIC COMPONENT

(75) Inventors: Toru Sirane, Izumo (JP); Shigeki Nishiyama, Izumo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/784,903

(22) Filed: Feb. 16, 2001

(65) Prior Publication Data

US 2002/0000825 A1 Jan. 3, 2002

(30) Foreign Application Priority Data

Mar. 30, 2000 (JP) ......................................... 2000-093877

(51) Int. Cl.[7] ............................................... G01R 31/12
(52) U.S. Cl. ......................................................... 324/548
(58) Field of Search .................................. 324/548, 557, 324/663, 678, 691, 693; 361/281, 320, 321.2

(56) References Cited

U.S. PATENT DOCUMENTS

| | | | | |
|---|---|---|---|---|
| 4,434,209 A | * | 2/1984 | Sasaki et al. | 428/416 |
| 6,054,865 A | * | 4/2000 | Bald et al. | 324/551 |
| 6,127,828 A | * | 10/2000 | Kamitani | 324/548 |
| 6,184,688 B1 | * | 2/2001 | Kamitani | 324/519 |
| 6,266,230 B1 | * | 7/2001 | Kato et al. | 361/321.2 |

* cited by examiner

Primary Examiner—N. Le
Assistant Examiner—Etienne P LeRoux
(74) Attorney, Agent, or Firm—Keating & Bennett, LLP

(57) ABSTRACT

A highly reliable method for screening a multi-layer ceramic electronic component, in which multi-layer ceramic electronic components having inner-structural defects and a reduced useful life are efficiently detected and removed. In this method, after applying an AC voltage to a multi-layer ceramic electronic component, a DC voltage is applied thereto. Then, by measuring the insulation-resistance value of the electronic component obtained when the DC voltage is applied, the quality of the multi-layer ceramic electronic component is checked. The applied AC voltage is in a range of 40 to 80% or 50 to 70% of a breakdown voltage. The applied DC voltage is between approximately a rated voltage and approximately twice the rated voltage. This method can, for example, be applied to the screening of a multi-layer ceramic capacitor.

9 Claims, 1 Drawing Sheet

RELATIONSHIP BETWEEN BREAKDOWN VOLTAGE AND APPLIED AC VOLTAGE (APPLIED AC VOLTAGE / BREAKDOWN VOLTAGE) (%)

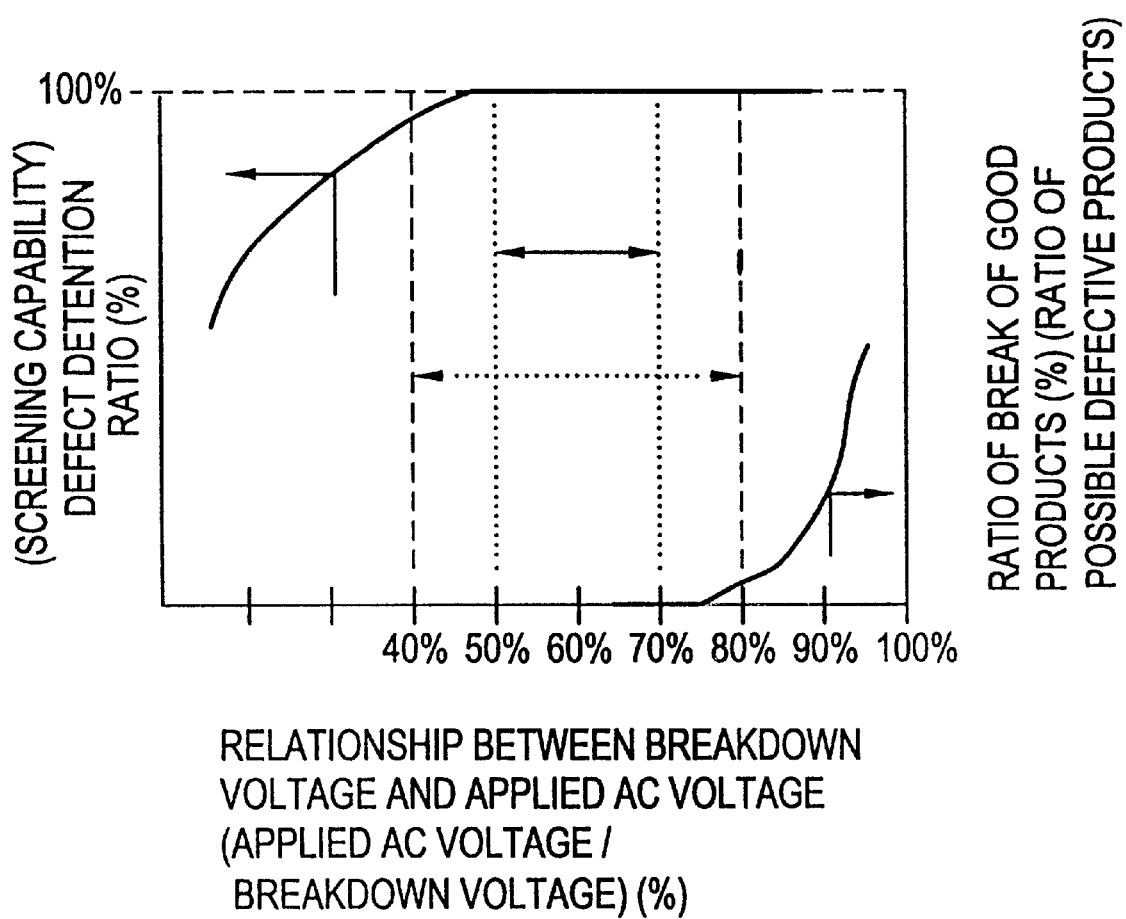

METHOD FOR SCREENING MULTI-LAYER CERAMIC ELECTRONIC COMPONENT

BACKGROUND OF THE INVENTION

1. Field of the Invention

The present invention relates to methods for screening multi-layer electronic components. More particularly, the present invention relates to screening methods to check the quality of multi-layer ceramic electronic components, such as multi-layer ceramic capacitors.

2. Description of the Related Art

Recently, multi-layer ceramic electronic components, such as a multi-layer ceramic capacitor and a multi-layer piezoelectric component have been widely used. Each of the multi-layer electronic components is defined by a multi-layer ceramic element having ceramic layers and internal electrode layers alternately laminated, and includes external electrodes electrically connected to the internal-electrode layers. Such multi-layer ceramic electronic components are manufactured using thin-films and multi-layered configurations.

Particularly, to satisfy the demands of the market, multi-layer ceramic capacitors have increasingly been manufactured using increasingly thinner films and an increased number of layers of the multi-layer configuration.

However, in multi-layer ceramic capacitors, due to the thinner ceramic layers, small structural defects inside dielectric members decrease the reliability of the products. As a result, it is difficult to prevent defective products from being manufactured. Thus, a screening method is necessary to check the products and remove defective products.

The following are known conventional screening methods: (1) a method in which a DC voltage is applied with a fixed polarity to measure insulation resistance; (2) a method in which a DC voltage is applied with a reversed polarity to measure insulation resistance; (3) a method in which a DC voltage is applied while heating to measure insulation resistance; and (4) a method in which a DC voltage is applied and changes in a leakage current are observed to detect and remove defective products.

As shown above, a DC voltage is applied in each of the methods described above. Thus, in each method, only a DC voltage electric load is applied to the multi-layer ceramic capacitor to screen the product.

As a result, the conventional methods are not capable of detecting a multi-layer ceramic capacitor having inner-structural defects and a reduced useful life. Thus, when a defective condition occurs in the product, the life of the product is greatly reduced.

In addition, the above-described problems occur not only in the case of multi-layer ceramic capacitors, but also in other types of multi-layer ceramic electronic components.

SUMMARY OF THE INVENTION

To overcome the above-described problems with the prior art, preferred embodiments of the present invention provide a highly reliable method for screening a multi-layer ceramic electronic component, by which multi-layer ceramic electronic components having inner-structural defects and a reduced useful life are efficiently detected and removed.

According to a preferred embodiment of the present invention, a method for screening a multi-layer ceramic electronic component having internal electrodes laminated via a ceramic layer in a ceramic element includes the steps of applying an AC voltage to the multi-layer ceramic electronic component, applying a DC voltage to the multi-layer ceramic electronic component, and measuring an insulation-resistance value obtained when the DC voltage is applied to check the quality of the multi-layer ceramic electronic component.

When the AC voltage is applied to the multi-layer ceramic electronic component, with the load of the current applied to the multi-layer ceramic electronic component, the electrical resistance of the component is detected. In other words, in the actual use of the component in which an AC voltage is applied thereto, when the multi-layer ceramic electronic component has inner-structural defects and a reduced useful life, the method effectively detects such potential problems of the component.

As described above, after applying the AC voltage to the multi-layer ceramic electronic component, the DC voltage is applied and then, the insulation resistance value of the component obtained when the DC voltage is applied is measured to check the quality of the multi-layer ceramic electronic component. As a result, unlike the conventional method, the method in accordance with preferred embodiments of the present invention efficiently detects multi-layer ceramic electronic components having inner-structural defects a reduced useful life.

In the screening method in accordance with preferred embodiments of the present invention, the applied AC voltage is preferably in a range of about 40% to about 80% of a breakdown voltage.

When the AC voltage ranging from about 40% to about 80% of the breakdown voltage is applied, the potential defects of the multi-layer ceramic electronic component are effectively detected. Thus, this is an advantage of preferred embodiments of the present invention.

In the above case, the AC voltage is preferably in the range of about 40% to about 80% of the breakdown voltage. This is range is preferred because, when the applied AC voltage is less than about 40% of the breakdown voltage, the effects of inner-structural defects and reduced useful life are greatly reduced, thus greatly reducing the detection thereof. In contrast, when the AC voltage is larger than about 80% of the breakdown voltage, even non-defective products may break down.

Furthermore, in the screening method in accordance with preferred embodiments of the present invention, the AC voltage ranging from about 50% to about 70% of a breakdown voltage may be applied to the multi-layer ceramic electronic component.

By applying the AC voltage ranging from about 50% to about 70% of the breakdown voltage, without breaking down non-defective products, defects are even more efficiently and quickly detected. This is a further advantage of preferred embodiments of the present invention.

In addition, in the screening method in accordance with preferred embodiments of the present invention, the applied DC voltage is between approximately a rated voltage and approximately twice the rated voltage.

When the DC voltage is in the above-described range to measure an insulation resistance value obtained when the DC voltage is applied, defects, such as an insulation resistance defects, of the multi-layer ceramic electronic component are reliably and efficiently detected. Thus, preferred embodiments of the present invention provide a highly reliable screening method.

In addition, the multi-layer ceramic electronic component may be a multi-layer ceramic capacitor.

Among multi-layer ceramic electronic components, particularly, multi-layer ceramic capacitors have been manufactured with very thin films and an increased number of layers in the multi-layered configuration. As a result, defects, such as insulation failures, inner-structural defects, and reduced useful lives, are more likely to occur. However, with the screening method of preferred embodiments of the present invention, defective products are efficiently and reliable detected and removed. Thus, a highly reliable multi-layer ceramic capacitor is obtained using the method according to preferred embodiments of the present invention.

Other features, elements, characteristics and advantages of the present invention will become apparent from the following detailed description of preferred embodiments thereof with reference to the attached drawings.

BRIEF DESCRIPTION OF THE DRAWINGS

The figure is a graph showing a result obtained when screening of multi-layer ceramic capacitors is performed by a method for screening ceramic electronic components according to a preferred embodiment of the present invention. The graph illustrates the relationships between ratios of an applied AC voltage with respect to a breakdown voltage in a multi-layer ceramic capacitor and screening capability (ratios in which defective products are detected by screening), and the relationships between the ratios of the applied AC voltage with respect to the breakdown voltage, and ratios in which non-defective products break down.

DETAILED DESCRIPTION OF PREFERRED EMBODIMENTS

Further explanation will be given below about the preferred embodiments of the present invention.

In the preferred embodiments of the present invention, screening of a multi-layer ceramic capacitor will be illustrated, as an example.

| Conditions of a multi-layer ceramic capacitor | |
|---|---|
| Dimensions: | Length L = 4.5 mm, Width W = 3.2 mm, and Height T = 2.6 mm |
| Capacity: | 0.1 $\mu$F |
| Rated voltage: | 500 V |
| Breakdown voltage: | DC 1000 V |

Screening
(1) Application of an AC voltage

An AC voltage of about 400V is applied to the multi-layer ceramic capacitor under the above conditions for one second.

Since the breakdown voltage of the multi-layer ceramic capacitor is 1000V, the applied AC voltage (400V) is equivalent to about 40% of the rated voltage.

(2) Application of a DC voltage and measurement of an insulation resistance

A DC voltage of about 500V is applied to the multi-layer ceramic capacitor for one second after the application of the AC voltage thereto under the above conditions.

Since the rated voltage of the multi-layer ceramic capacitor is 500V, the applied DC voltage (500V) is approximately equal to the rated voltage.

Example for Comparison

For comparison, except for omitting of the application process (1) of the above AC voltage, screening was performed under the same conditions as those given in the above-described preferred embodiment.

Evaluation

From the same lot, a set of 10,000 pieces of multi-layer ceramic capacitors was selected for comparison of screening methods. Then, a description will be given of the evaluation of results from the method according to the preferred embodiment and the method of the example used for comparison.

(1) Screening by the example for comparison: First screening: Three defective products were detected. Second screening: Two defective products were detected. Third screening: one defective product was detected. Fourth screening: No defective product was detected.

As shown above, in the method of the compared example excluding a step of applying an AC voltage, all six defective products were detected in three screenings. This was first confirmed by performing the fourth screening.

(2) Screening by the method according to the preferred embodiment of the present invention: First screening: Six defective products were detected. Second screening: No defective product was detected.

When the screening was performed by the method according to the preferred embodiment including the step of applying an AC voltage, all six defective products were detected in the first screening. Additionally, this was confirmed by performing the second screening.

Therefore, with the screening method of the compared example, screening must be repeatedly performed until no defective products are detected, that is, until the fourth round. However, with the screening method of the preferred embodiment according to the present invention, after confirmation that all of the defective products are detected in the first screening, the process is completed with only one additional screening. Thus, the method of the present preferred embodiment of the present invention greatly increases the efficiency of screening steps.

In the figure, with changes in the AC voltage applied to the multi-layer ceramic capacitor, relationships are shown between ratios of the applied AC voltage with respect to the breakdown voltage of the multi-layer ceramic capacitor and screening performance (ratios in which defective products can be detected by screening), and the relationships between the ratios of the applied AC voltage with respect to the breakdown voltage and ratios in which non-defective products break down.

In the figure, when an AC voltage over about 40% of the breakdown voltage is applied, all defective products are detected. In addition, obviously, when the AC voltage reaches about 50% of the breakdown voltage, all defective products are detected.

Furthermore, in the figure, when an AC voltage up to about 70% of the breakdown voltage is applied, wherein no non-defective product break down, all defective products are detected. However, when an AC voltage over about 75% of the breakdown voltage is applied, some non-defective products break down, and when the applied AC voltage is over about 80% thereof, the ratio of broken-down non-defective products reaches a substantial level.

Thus, in preferred embodiments of the present invention, preferably, an AC voltage of about 40% to about 80% of the breakdown voltage is applied. More preferably, an AC voltage of about 50% to about 70% of the breakdown voltage is applied.

In this preferred embodiment, screening is performed on a multi-layer ceramic capacitor as the screening product. However, the present invention can be applied to other types of multi-layer ceramic electronic components, each having a plurality of internal electrodes laminated via a ceramic layer in a ceramic element.

Additionally, in other respects, the present invention is not restricted to the above-described preferred embodiments. Regarding the dimensions of the multi-layer ceramic electronic component used in the invention, a time for applying an AC voltage, and other variables, various modifications and changes can be made within the spirit and scope of the present invention.

As described above, in the method for screening a multi-layer ceramic electronic component according to preferred embodiments of the present invention, after applying an AC voltage to the multi-layer ceramic electronic component, a DC voltage is applied to measure an insulation-resistance value obtained when the DC voltage is applied. With this arrangement, the quality of the multi-layer ceramic electronic component is effectively monitored. With the AC voltage applied to the multi-layer ceramic electronic component, a current load is additionally applied to the multi-layer ceramic electronic component. As a result, if the multi-layer ceramic electronic component has inner-structural defects or a reduced useful life when actually used, such potential problems are efficiently detected.

Thus, by the above-described method provides for checking the quality of the multi-layer ceramic electronic component, defective products having inner-structural defects and a reduced useful life are efficiently detected and removed. Such effective screening is not possible with the conventional methods.

Furthermore, when an AC voltage from about 40% to about 80% of the breakdown voltage is applied, regarding a multi-layer ceramic electronic component having inner-structural defects and reduced useful life, these potential defects are effectively and reliably detected. Thus, a highly reliable screening is performed.

Furthermore, with the application of the AC voltage ranging from about 50% to about 70% of the breakdown voltage, more reliably, without breaking down non-defective products, inner-structural defects and reduced useful life are efficiently and reliably detected in a short time without fail. This is a further advantage of the present invention.

Furthermore, when a DC voltage between approximately a rated voltage and approximately twice the rated voltage is applied to the ceramic electronic component, usual insulation-resistance failures are efficiently and reliably detected. Thus, the method of preferred embodiments of the present invention produces a highly reliable screening.

Among multi-layer ceramic electronic components, multi-layer ceramic capacitors have increasingly been manufactured in very thin films and an increased number of layers in the multi-layered configurations. As a result, insulation defects, inner-structural defects, and reduced useful life occur. However, with the screening method of the present invention, defective products are efficiently detected and removed. Thus, a highly reliable multi-layer ceramic capacitor is obtained.

While the invention has been described with reference to preferred embodiments, it will be understood by those skilled in the art that other modifications can be made without departing from the spirit and scope of the invention.

What is claimed is:

1. A method for screening a multi-layer ceramic electronic component having internal electrodes which are laminated via a ceramic layer in a ceramic element, the method comprising the steps of:

applying an AC voltage to the multi-layer ceramic electronic component;

applying a DC voltage to the multi-layer ceramic electronic component; and measuring an insulation-resistance value obtained when the DC voltage is applied to check the quality of the multi-layer ceramic electronic component; wherein the applied AC voltage in a range of about 40% to about 80% of a breakdown voltage.

2. A method for screening a multi-layer ceramic electronic component according to claim 1, wherein the applied AC voltage is in a range of about 50% to about 70% of a breakdown voltage.

3. A method for screening a multi-layer ceramic electronic component according claim 1, wherein the applied DC voltage is between a rated voltage and approximately twice the rated voltage.

4. A method for screening a multi-layer ceramic electronic component according claim 2, wherein the applied DC voltage is between approximately a rated voltage and approximately twice the rated voltage.

5. A method for screening a multi-layer ceramic electronic component according to claim 3, wherein the applied DC voltage is between approximately a rated voltage and approximately twice the rated voltage.

6. A method for screening a multi-layer ceramic electronic component according to claim 1, wherein the multi-layer ceramic electronic component is a multi-layer ceramic capacitor.

7. A method for screening a multi-layer ceramic electronic component according to claim 1, wherein the step of applying the AC voltage is performed before the step of applying the DC voltage.

8. A method for screening a multi-layer ceramic electronic component according to claim 1, wherein the applied AC voltage is about 400V.

9. A method for screening a multi-layer ceramic electronic component according to claim 1, wherein the applied DC voltage is about 500V.

* * * * *